United States Patent
Maa et al.

(10) Patent No.: US 7,226,504 B2
(45) Date of Patent: Jun. 5, 2007

(54) METHOD TO FORM THICK RELAXED SIGE LAYER WITH TRENCH STRUCTURE

(75) Inventors: Jer-Shen Maa, Vancouver, WA (US); Douglas James Tweet, Camas, WA (US); Tingkai Li, Vancouver, WA (US); Jong-Jan Lee, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 171 days.

(21) Appl. No.: 10/062,336

(22) Filed: Jan. 31, 2002

(65) Prior Publication Data

US 2003/0140844 A1 Jul. 31, 2003

(51) Int. Cl.
*C30B 33/02* (2006.01)

(52) U.S. Cl. .................... 117/3; 117/4; 117/88; 117/95; 117/97; 117/930; 117/936

(58) Field of Classification Search .................... 117/3, 117/4, 88, 95, 97, 930, 936
See application file for complete search history.

(56) References Cited

U.S. PATENT DOCUMENTS

| | | | | |
|---|---|---|---|---|
| 5,298,452 A | * | 3/1994 | Meyerson | 438/508 |
| 5,300,454 A | * | 4/1994 | Taft et al. | 438/234 |
| 5,685,946 A | * | 11/1997 | Fathauer et al. | 438/500 |
| 5,895,242 A | * | 4/1999 | Wen | 438/275 |
| 6,059,895 A | * | 5/2000 | Chu et al. | 148/33.1 |
| 6,114,255 A | * | 9/2000 | Juengling | 438/763 |
| 6,171,936 B1 | * | 1/2001 | Fitzgerald | 438/503 |
| 6,372,593 B1 | * | 4/2002 | Hattori et al. | 438/311 |
| 6,429,061 B1 | * | 8/2002 | Rim | 438/198 |
| 6,464,780 B1 | * | 10/2002 | Mantl et al. | 117/90 |

FOREIGN PATENT DOCUMENTS

FR 2796757 A1 * 1/2001

OTHER PUBLICATIONS

LeGoes et al. "Relaxation of SiGe thin films grown on Si/SiO2 substrates", (1994), J. Appl. Phys. 75 (11) pp. 7240-7246.*

(Continued)

*Primary Examiner*—Yogendra N. Gupta
*Assistant Examiner*—Matthew J. Song
(74) *Attorney, Agent, or Firm*—Robert D. Varitz, PC

(57) ABSTRACT

A method of forming a SiGe layer having a relatively high germanium content and a relatively low threading dislocation density includes preparing a silicon substrate; depositing a layer of SiGe to a thickness of between about 100 nm to 500 nm, wherein the germanium content of the SiGe layer is greater than 20%, by atomic ratio; implanting H+ ions into the SiGe layer at a dose of between about $1·10^{16}$ cm$^{-2}$ to $5·10^{16}$ cm$^{-2}$, at an energy of between about 20 keV to 45 keV; patterning the SiGe layer with photoresist; plasma etching the structure to form trenches about regions; removing the photoresist; and thermal annealing the substrate and SiGe layer, to relax the SiGe layer, in an inert atmosphere at a temperature of between about 650° C. to 950° C. for between about 30 seconds and 30 minutes.

13 Claims, 7 Drawing Sheets

OTHER PUBLICATIONS

Trinkaus et al. "Strain relaxation mechanism for hydrogen-implanted Si1-xGex/Si (100) heterostructures", Jun. 12, 2000, American Institute of Physics vol. 76, No. 24, pp. 3552-3554.*

Patent Abstracts of Japan. English Abstract of JP 10-093025 (1996).*

Article entitled, "Defects in Epitaxial Multilayers", by J. W. Matthews et al., published in Journal of Crystal Growth 27 (1974) pp. 118-125.

Article entitled, "Nucleation of Misfit Dislocations in Strained-Layer Eitaxy in the $Ge_xSi_{1-x}$/Si System", by R. Hull et al., published in J. Vac. Sci. Technol. A7(4), Jul.Aug. 1989, pp. 2580-2585.

Article entitled, "Totally Relaxed $Ge_xSi_{1-x}$ Layers with Low Threading Dislocation Densities Grown on Si Substrates", by E. A. Fitzgerald, et al., published in Appl. Phys. Lett. 59 (7) Aug. 12, 1991 pp. 811-813.

Article entitled, "Strain Relaxation Kinetics in $Si_{1-x}Ge_x$/Si Heterostructures", by D. C. Houghton., published in J. Appl. Phys. 70(4) Aug. 15, 1991 pp. 2136-2151.

Letter to the Editor entitled, "High-Electron-Mobility Si/SiGe Heterostructures; Influence of the Relaxed SiGe Buffer Layer", by F. Schäffler et al., Semicond.Sci.Technol. 7(1992) pp. 260-266.

Article entitled, "Investigation of Dislocations in $Si_{1-x}Ge_x$/Si Heterosructures Grown by LPCVD" by H.P. Tang et al., published in Journal of Crystal Growth 125(1992) pp. 301-310.

Article entitled, "High Electron Mobility in Modulation-doped Si/SiGe" by K. Ismail et al., published in Appl. Phys. Lett. 58 (19), May 13, 1991, pp. 2117-2119.

Artilce entitled, "Relaxation of SiGe Thin Films Grown on $Si/SiO_2$ Substrates" by F. K. LeGoues et al., published in J. Appl. Phys. 75(11), Jun. 1, 1994, pp. 7240-7246.

Article entitled, "Cavity-dislocation Interactions in Si-Ge and Implications for heterostructure relaxation", by D. M. Follstaedt et al., published in Appl. Phys. Lett. 69 (14), Sep. 30, 1996, pp. 2059-2061.

Article entitled, "Determination of the activation energy for the heterogeneous nucleation of misfit dislocations in $Si_{1-x}Ge_x$/Si deposited by selective epitaxy" by S. Wickenhauser et al., published in Appl. Phys. Lett. 70(30), Jan. 20, 1997, pp. 324-326.

Article entitled, "On the mechanism of the hydrogen-induced exfoliation of silicon", by M. K. Weldon, published in J. Vac. Sci. Technol. B 15(4), Jul./Aug. 1997, pp. 1065-1073.

Article entitled, "Investigation of Plastic Relaxation in $Si_{1-x}Ge_x$/Si Deposited by Selective Epitaxy" by Wichenhauser et al., published in Mat. Res. Soc. Symp. Proc. vol. 533, pp. 69-75.

Article entitled, "Strain Relaxation Mechanism for Hydrogen-implanted $Si_{1-x}Ge_x$/Si(100) heterostructures", by H. Trinkaus et al., published in Applied Physics Letters vol. 76, #24, pp. 3552-3554.

Article entitled, "Strain relaxation of epitaxial SiGe layers on Si(100) improved by hydrogen implantation", by S. Mantl et al., by S. Mantl published by Nuclear Instruments and Methods in Physics Research B 147(1999) pp. 29-34.

Article entitled, "Totally Relaxed $Ge_xSi_{1-x}$ Layers with Low Threading Dislocation Densities Grown in Si Substrates", by E. A. Fitzgerald et al., published in Appl. Phys. Lett. 59 (7), Aug. 12, 1991, pp. 811-813.

* cited by examiner

METHOD TO FORM THICK RELAXED SIGE LAYER WITH TRENCH STRUCTURE

RELATED APPLICATION

This application is related to Ser. No. 10/062,319, filed Jan. 31, 2002, for Method to form relaxed SiGe layer with high Ge content, published as U.S. Patent Publication No. 2003/0143783.

FIELD OF THE INVENTION

This invention relates to enhanced mobility MOSFET devices, and specifically to a method providing a thick SiGe film through the use of trench structure.

BACKGROUND OF THE INVENTION

In enhanced mobility MOSFET device application, relaxed $Si_{1-x}Ge_x$ buffer layers have been used as virtual substrates for strained silicon layers to increase carrier mobility, K. Ismail et al., *High electron mobility in modulation-doped Si/SiGe*, Appl. Phys. Lett., 58, 2117, 1991; and S. Wickenhauser et al., *Investigation of plastic relaxation in $Si_{1-x}Ge_x/Si$ deposited by selected epitaxy*, Mat. Res. Soc. Sypm. Proc. Vol. 533, 69, 1998. $Si_{1-x}Ge_x$ layers relax plastically by the formation of misfit dislocations, R. Hull et al., *Nucleation of misfit dislocations in strained-layer epitaxy in the $Ge_xSi_{1-x}/Si$ system*, J. Vac Sci. Technol., A7, 2580, 1989; Houghton, *Strain relaxation kinetics in $Si_{1-x}Ge_x/Si$ heterostructures*, J. Appl. Phys., 70, 2136, 1991; Wickenhauser et al., *Determination of the activation energy for the heterogeneous nucleation of misfit dislocations in $Si_{1-x}Ge_x/Si$ deposited by selective epitaxy*, Appl. Phys. Lett., 70, 324, 1997; Matthews et al., *Defects in epitaxial multilayers*, J. Cryst. Growth, 27, 118, 1974; and Tang et al., *Investigation of dislocations in $Si_{1-x}Ge_x/Si$ heterostructures grown by LPCVD*, J. Cryst. Growth, 125, 301, 1992. However, during this process, threading dislocations usually are created. The existence of threading dislocations degrades device performance and reduces device yield significantly.

The current technique to produce a high quality $Si_{1-x}Ge_x$ buffer layer is the growth of a several μm thick compositionally graded layer, Schaffler et al., *High-electron-mobility Si/SiGe heterostructures: influence of the relaxed SiGe buffer layer*, Semiconductor. Sci. Technol., 7. 260, 1992; and Fitzgerald et al., *Totally relaxed $Ge_xSi_{1-x}$ layers with low threading dislocation densities grown on Si substrates*, Appl. Phys. Lett., 59, 811, 1991. The density of threading dislocations is still high, and the integration of a several μm thick $Si_{1-x}Ge_x$ layer into commercial device fabrication is not practical. The relaxation of SiGe grown on Separation by IMplantation of Oxygen (SIMOX) wafers has also been investigated, where the Si/SiGe bilayer behaves as a free-floating foil constrained to remain flat by the substrate. However, the ratio of thicknesses between the silicon and SiGe layers must be carefully selected to move the nucleation and glide of dislocations from the SiGe layer to the silicon layer. Further, this prior art technique needs to be modified to accommodate higher germanium content in order to have utility for most technological applications, LeGouse et al., *Relaxation of SiGe thin films grown on $Si/SiO_2$ substrates*, J. Appl. Phys. 75, 7240 1994.

Cavities formed in silicon and germanium and their alloys by helium implantation and annealing have been found to have a strong short-range, attractive interaction with dislocations. Introducing cavities at the SiGe/Si interface greatly enhances the relaxation rate and alters dislocation microstructures. However, reduction of threading dislocation density was not observed, Follstaedt et al., *Cavity-dislocation interactions in Si-Ge and implications for heterostructure relaxation*, Appl. Phys. Lett., 69, 2059, 1996. To achieve an 80% relaxation of the SiGe layer still required a one hour 1000° C. anneal.

Hydrogen implantation has been found to induce exfoliation of silicon and cause shearing of macroscopic layers of silicon, Weldon et al, *On the mechanism of the hydrogen-induced exfoliation of silicon*, J. Vac. Sci. Technol. B. 15, 1065, 1997. This technology has been applied to the fabrication of high-quality silicon-on-insulator (SOI) wafers, known as the SmartCut™ process. In recent publication, S. Mantl et al, *Strain relaxation of epitaxial SiGe layers on Si(100) improved by hydrogen implantation*, Nuclear Instruments and Methods in Physics Research B 147, 29, (1999), and H. Trinkaus et al, *Strain relaxation mechanism for hydrogen-implanted $Si_{1-x}Ge_x/Si(100)$ heterostructures*, Appl. Phys. Lett., 76, 3552, 2000, have reported the advantages of using hydrogen implantation to increase the degree of SiGe relaxation and to reduce the density of threading dislocation. However, a relaxation of a SiGe layer of between 2000 Å and 2500 Å was reported. A SiGe layer of such thickness is not sufficient for commercial device application.

Previously, methods to form thick relaxed SiGe layer on silicon and a method to form a relaxed SiGe layer with high germanium content are disclosed in the above-cited related application, which is incorporated herein by reference. Highly relaxed SiGe films having a Ge content of 20% to 30%, or higher, by atomic ratio, with thicknesses exceeding 3000 Å have been achieved utilizing either a two layer SiGe process or a graded SiGe process.

SUMMARY OF THE INVENTION

A method of forming a SiGe layer having a relatively high germanium content and a relatively low threading dislocation density includes preparing a silicon substrate; depositing a layer of SiGe to a thickness of between about 100 nm to 500 nm, wherein the germanium content of the SiGe layer is greater than 20%, by atomic ratio; implanting H+ ions into the SiGe layer at a dose of between about $1 \cdot 10^{16}$ cm$^{-2}$ to $5 \cdot 10^{16}$ cm$^{-2}$, at an energy of between about 20 keV to 45 keV; patterning the SiGe layer with photoresist; plasma etching the structure to form trenches about regions having side dimensions less than or equal to 4μ×4μ; removing the photoresist; and thermal annealing the substrate and SiGe layer, to relax the SiGe layer, in an inert atmosphere at a temperature of between about 650° C. to 950° C. for between about 30 seconds and 30 minutes.

An object of the invention is to fabricate a relaxed SiGe film on a trench structure.

Another object of the invention is to provide a SiGe layer having low threading dislocation density through uniform relaxation of strain in the SiGe film.

A further object of the invention is to provide a method of fabricating a SiGe layer having a thickness greater than 2000 Å.

This summary and objectives of the invention are provided to enable quick comprehension of the nature of the invention. A more thorough understanding of the invention may be obtained by reference to the following detailed description of the preferred embodiment of the invention in connection with the drawings.

DETAILED DESCRIPTION OF THE PREFERRED EMBODIMENTS

Figure 1:
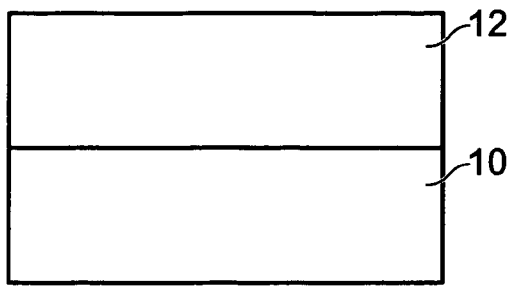
FIGS. 1-3 depict steps in the fabrication of a SiGe according to the method of the invention.

The goal of this invention is to produce a relaxed SiGe film layer having a thickness greater than 2000 Å, without the problems and defects of the prior art. The method of the invention uses H+ implantation and trench formation to enhance SiGe relaxation. Referring to FIG. 1, a silicon substrate 10, which may be bulk silicon or SIMOX, is prepared. A layer 12 of strained SiGe is deposited on the substrate. The thickness of the first SiGe layer may be in the range of between about 150 nm to 500 nm, with a preferred thickness of about 200 nm of strained SiGe deposited on the silicon substrate. The growth conditions and source gases should be chosen to minimize surface roughness while ensuring good crystallinity. This requires a low temperature growth, e.g., 400° C. to 600° C., to produce a metastable, strained SiGe film.

Figure 2:
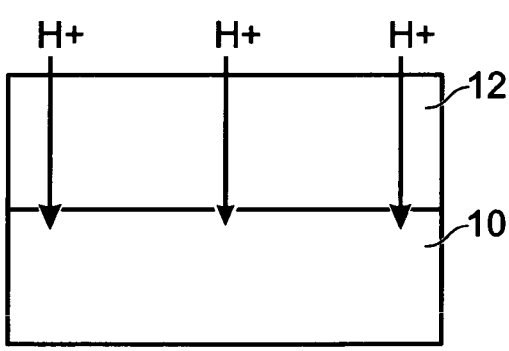

Referring to FIG. 2, H+ implantation is performed. The dose of H+ is in the range of between about $1 \cdot 10^{16}$ cm$^{-2}$ to $5 \cdot 10^{16}$ cm$^{-2}$. The energy level depends on the SiGe thickness, and is typically in the range of between about 20 keV to 45 keV. The SiGe layer is patterned with photoresist and plasma etched to form trenches, which trenches are constructed to form regions having side dimensions of less than or equal to 4μ×4μ, wherein "μ", preferably in a checkerboard pattern. The photoresist is removed following the etching process.

Figure 3:
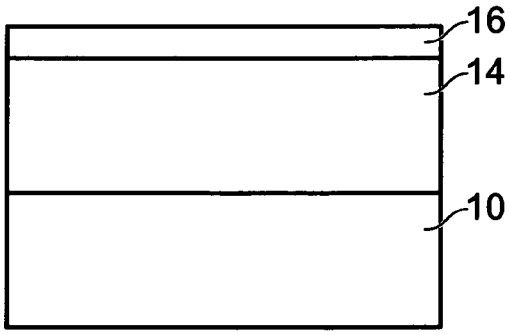

Referring to FIG. 3, annealing is performed in an inert ambient atmosphere, such as argon, at a temperature in the range of between about 650° C. to 950° C., thus converting SiGe layer 12 to a relaxed SiGe layer 14. A second SiGe layer 16 may be deposited on top of the first layer. The second SiGe layer is deposited in a low temperature deposition step, at a temperature in a range of between about 650° C. to 950° C., to a thickness of about 170 nm on a 200 nm thick layer of relaxed SiGe. The second SiGe layer may be deposited in a thickness range of between about 50 nm to 200 nm. The resulting structure demonstrates a high degree of relaxation and a smooth surface.

The method of the invention couples the method of the above-identified related application of relaxation through hydrogen implantation together with the formation of a trench structure. The trench structure of the method of the invention is formed before the relaxation annealing of the SiGe layer. The method of the invention provides a technique to further lower threading dislocation density through uniform relaxation of strain in the SiGe film.

FIGS. 4-15 depict the effect of trench patterning on blister formation. The percentage of germanium in the SiGe film of the example is about 30%, by atomic ratio. The example film is H+ implanted at 26 keV at a dose of $3 \cdot 10^{16}$ cm$^{-2}$. The film is etched to form a checkerboard structure, and is then annealed at about 800° C. It is interesting to note that no blister, or very little blister, is detected in the 2μ×2μ structure, FIG. 4, and in the 4μ×4μ structure, FIG. 5, however, blisters are detected on larger structures of 8μ×8μ, FIG. 6, and 16μ×16μ, FIG. 7.

The use of 2μ×2μ, 4μ×4μ, or 8μ×8μ, and 16μ×16μ structures is by way of example only. These structures are used to demonstrate relaxation of SiGe films on small structures. Because 50% of the surface is still SiGe, relaxation can be easily measured by X-ray diffraction. As a result of the examples used herein, it is apparent that features having a side dimension of 4μ or less are suitable for use in the method of the invention. The features may be grouped together or used as separate elements.

Figure 4:
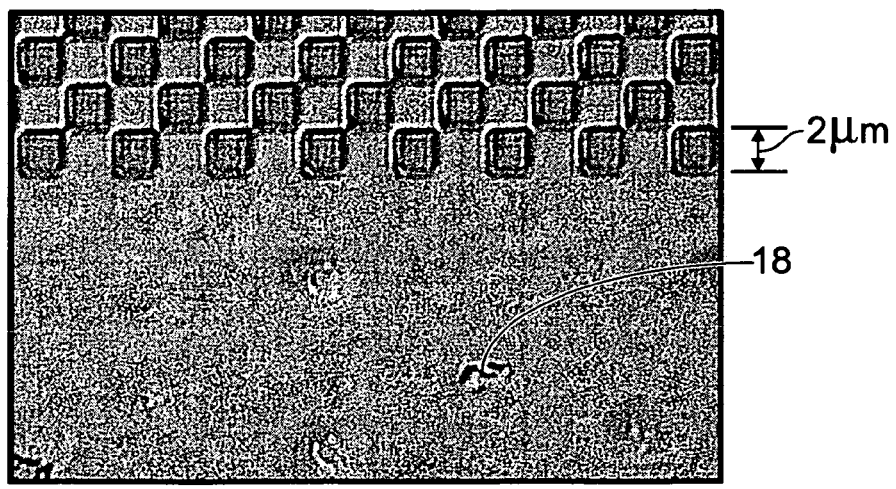
FIG. 4 depicts a 2μ×2μ region, surrounded by a trench constructed to the method of the invention, exhibiting minimal blistering effect.
Figure 5:
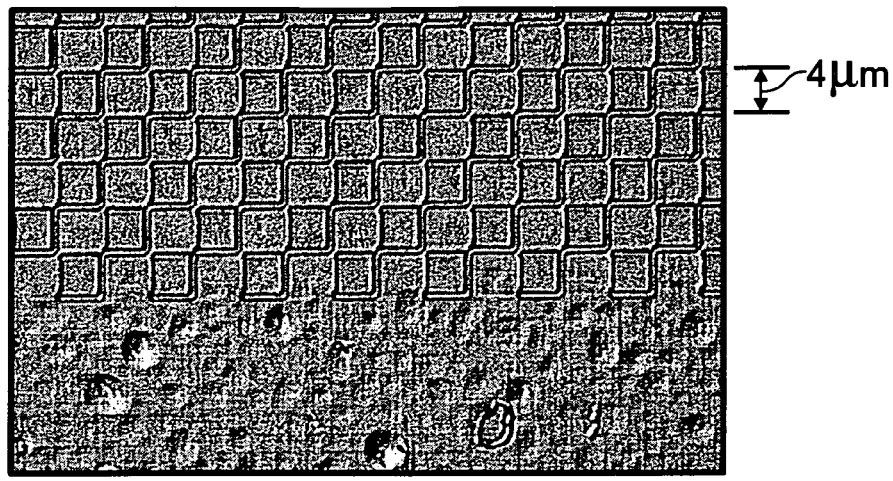
FIG. 5 depicts a 4μ×4μ region, surrounded by a trench constructed to the method of the invention, exhibiting minor blistering effect.
Figure 6:
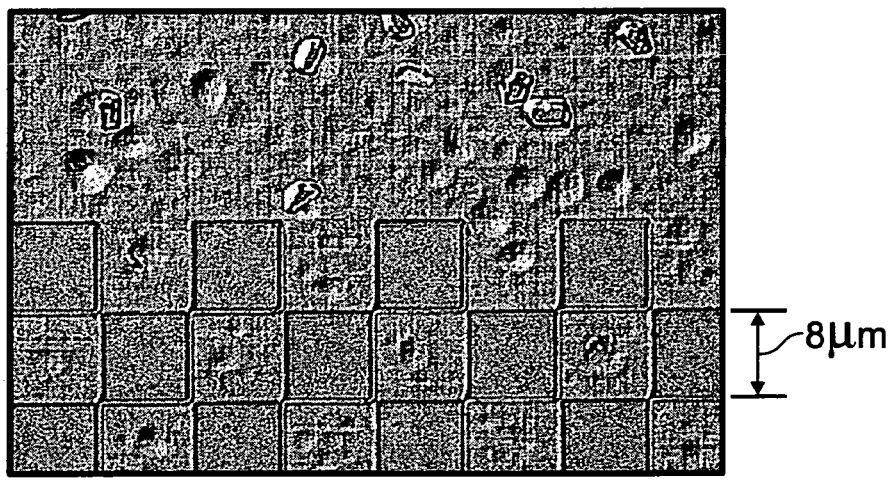
FIG. 6 depicts a 8μ×8μ region, surrounded by a trench constructed to the method of the invention, exhibiting blistering effect.
Figure 7:
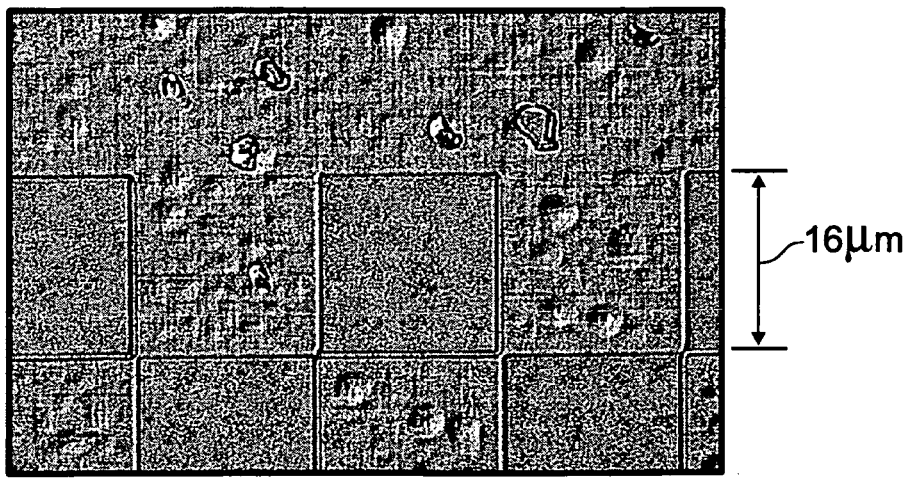
FIG. 7 depicts a 16μ×16μ region, surrounded by a trench constructed to the method of the invention, exhibiting blistering effect.

The blisters shown in the microphotographs form from the high compressive stress generated in the SiGe film during annealing. In thicker films, having a higher Ge content and implanted with a higher dose of H+, there a greater likelihood that blisters will form. While the formation of a blister is another form of stress relaxation of the SiGe film, it is not a desirable feature because a blister causes the SiGe film to detach from the silicon substrate. FIG. 4, shows a flat bottom structure after the dome of a blister has burst, at 18.

The lack of blisters in the 2μ×2μ trench structure, and few blisters in 4μ×4μ trench structure, is not due to the loss of hydrogen from the sidewall of the trench structure, rather, when the SiGe film is less than 0.5μ, it is easier for the hydrogen to reach the top surface and leave the film. The lack of blister is an indication of stress relief from the film, as a result of the small dimension.

Figure 8:
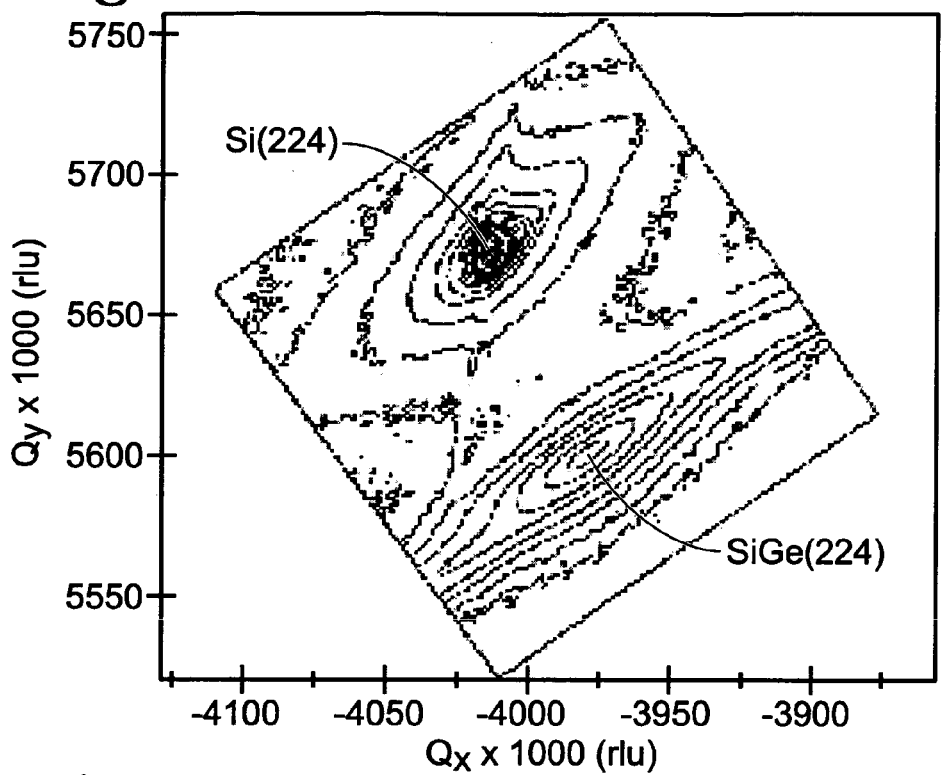
FIG. 8 depicts an X-ray diffraction of a 2μ×2μ region.
Figure 9:
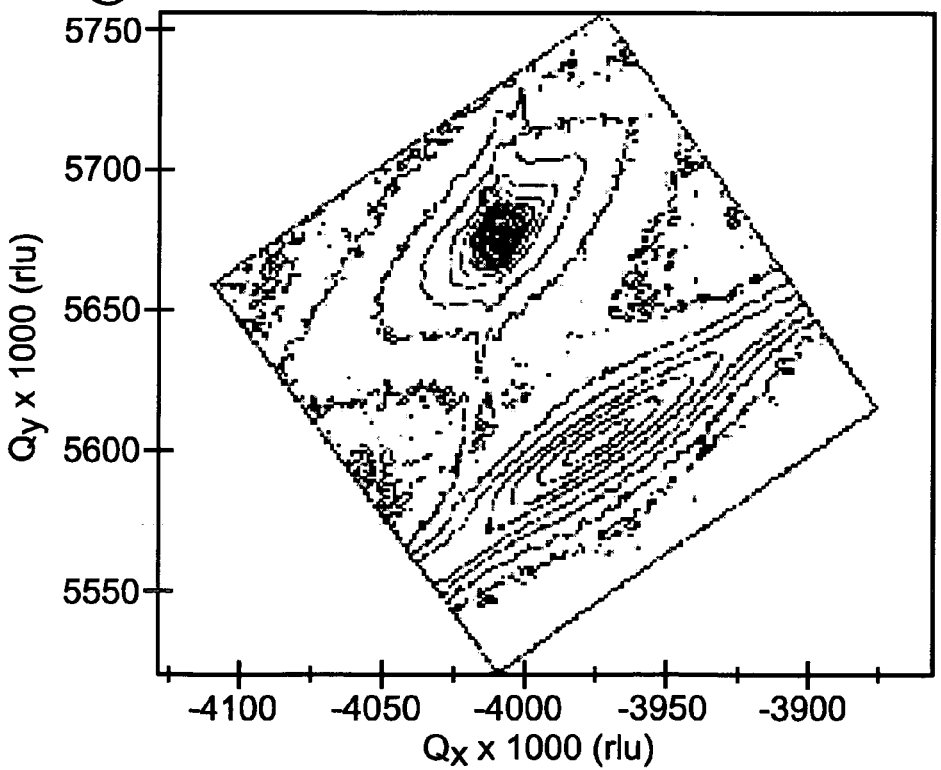
FIG. 9 depicts an X-ray diffraction of a 4μ×4μ region.
Figure 10:
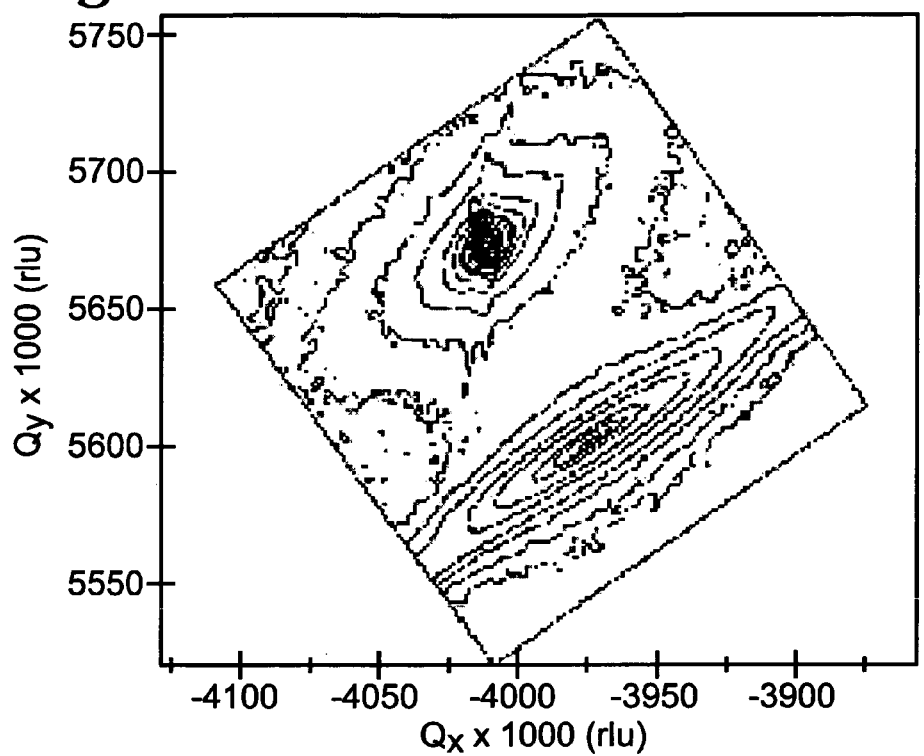
FIG. 10 depicts an X-ray diffraction of a 8μ×8μ region.
Figure 11:
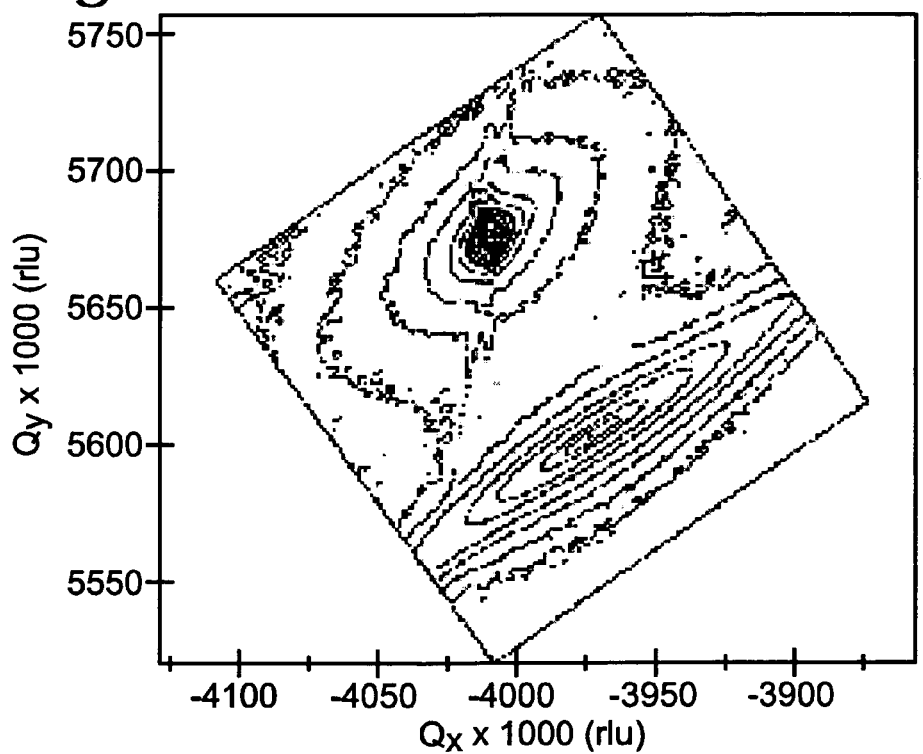
FIG. 11 depicts an X-ray diffraction of a 16μ×16μ region.
Figure 12:
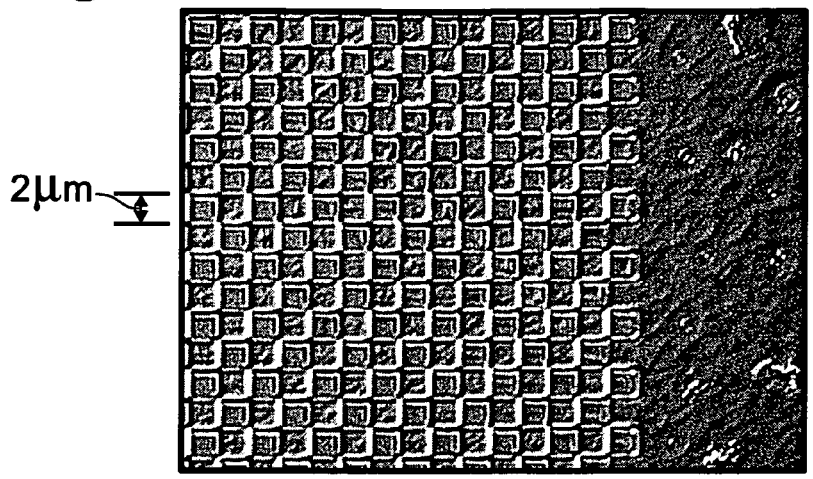
FIG. 12 depicts a 2μ×2μ region following fifteen seconds of Schimmel etching.
Figure 13:
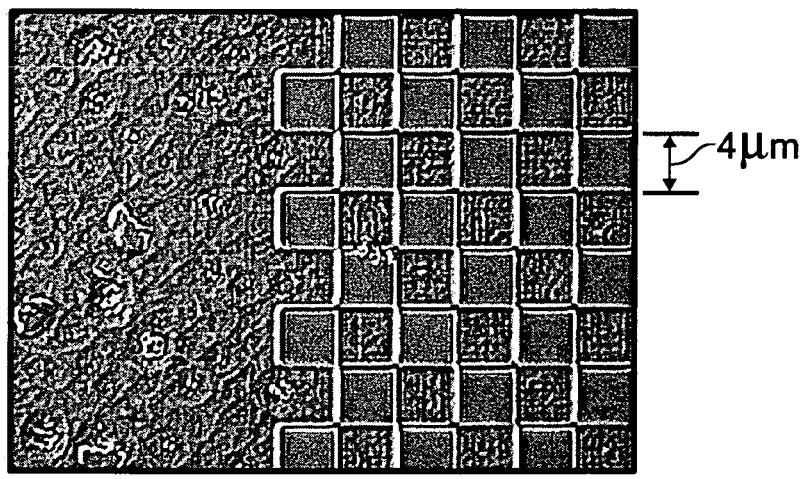
FIG. 13 depicts a 4μ×4μ region following fifteen seconds of Schimmel etching.
Figure 14:
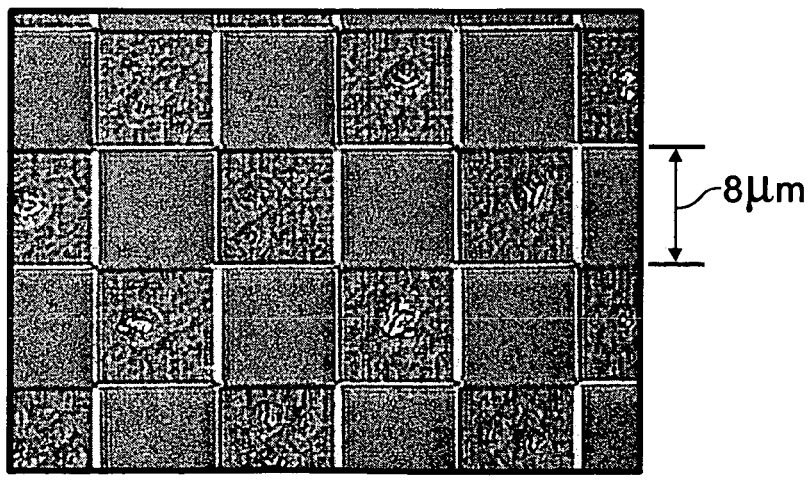
FIG. 14 depicts a 8μ×8μ region following fifteen seconds of Schimmel etching.
Figure 15:
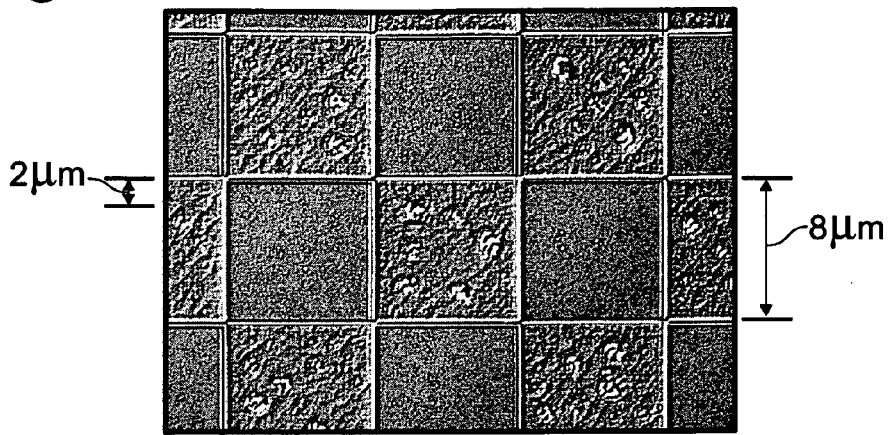
FIG. 15 depicts a 16μ×16μ region following fifteen seconds of Schimmel etching.

The corresponding X-ray diffraction mapping is shown in FIGS. 8-11. The relaxation of the sample is about 80%-85%. Even in the 2μ×2μ structure, FIG. 8, relaxation is achieved. X-ray diffraction mapping shows a more elongated SiGe (224) peak, however. FIG. 8 is of the 2μ×2μ sample, taken in the upper left quadrant, about 35 mm from the edge; where x=0.294, and R=79.34%, where x is the atomic ratio of Ge in the SiGe film, and R is the percentage of relaxation. FIG. 9 is of the 4μ×4μ sample, taken in the upper right quadrant, about 38 mm from the edge, where x=0.295, and R=80.74%. FIG. 10 is of the 8μ×8μ sample, taken in the lower left quadrant, about 40 mm from the edge; where x=0.299, and R=84.42%, FIG. 11 is of the 16μ×16μ sample, taken in the lower right quadrant, about 45 mm from the edge; where x=0.294, and R=81.89%.

FIG. 12-15 were taken after the film had been etched in Schimmel etch for fifteen seconds. Schimmel etch is a mixture of four parts 50% HF: five parts 0.3M $CrO_3$. No defects were detected on the 2μ×2μ structure, FIG. 12, nor on the 4μ×4μ structure, FIG. 13. A high density of defects was detected in the 8μ×8μ structure, FIG. 14, and in the 16μ×16μ structure, FIG. 15. There is a strong indication that smaller feature and a single SiGe layer are more conducive to achieving a structure containing a low defect relaxed SiGe film.

Figure 16:
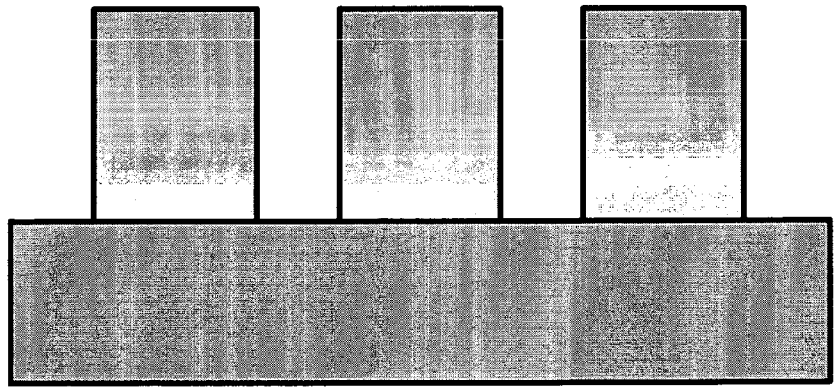
FIG. 16 depicts a schematic, exaggerated profile of a SiGe structure before relaxation annealing.
Figure 17:
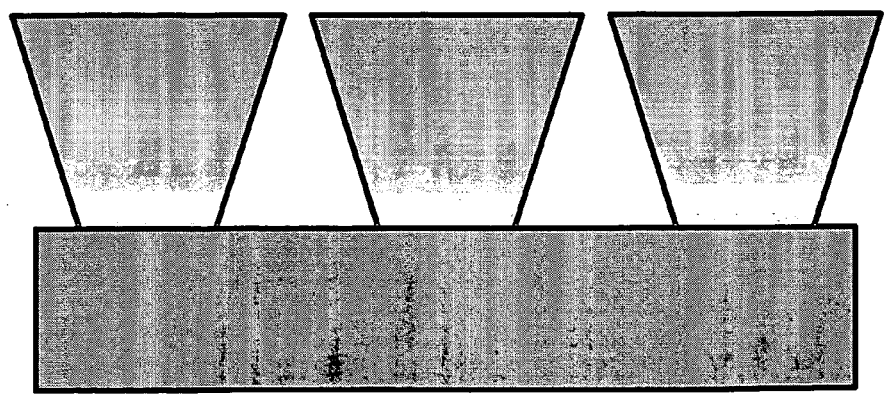
FIG. 17 depicts a schematic, exaggerated profile of a SiGe structure after relaxation annealing.

In practice, hydrogen implantation may be performed either before or after the trench formation. The preferred composition of the SiGe layer is a graded structure, wherein the germanium content begins at a low percentage near the Si/SiGe interface and slowly increases as the film thickness increases. The advantage of this graded composition is that the strain of the SiGe film may be relaxed uniformly along the vertical direction. Near the top surface, where the germanium content is the highest, the relaxation is also greater. At the bottom of the trench structure of the invention, where the germanium content is lower, the degree of relaxation is lower. FIG. 16 is an exaggerated profile of the SiGe structure before relaxation anneal. FIG. 17 is an exaggerated profile of the graded SiGe trench structure after relaxation annealing.

The formation of threading dislocation is mostly related to the misfit dislocation formation. When a film having a different lattice constant deposited on a substrate, the strain in the film is generated as the result of the matching of the lattice constant of the substrate. The strain is relieved by the formation of misfit dislocations and the motion of threading dislocation from both ends of the misfit dislocation. In smaller structures, the likelihood that a threading dislocation will reach the sidewall is much higher. Therefore it is expected that the threading dislocation density is lower in smaller structure.

The advantage of a trench structure having a gradual increase of Ge concentration from the substrate interface to the top of the structure is that the strain will be relieved in a more uniform manner. Because of the gradual increase of the lattice constant near the surface of the film, once the film is relaxed, along its vertical axis, the increase of the feature dimension is also uniform, which results in a more thorough relaxation of the film in this structure.

Figure 18:
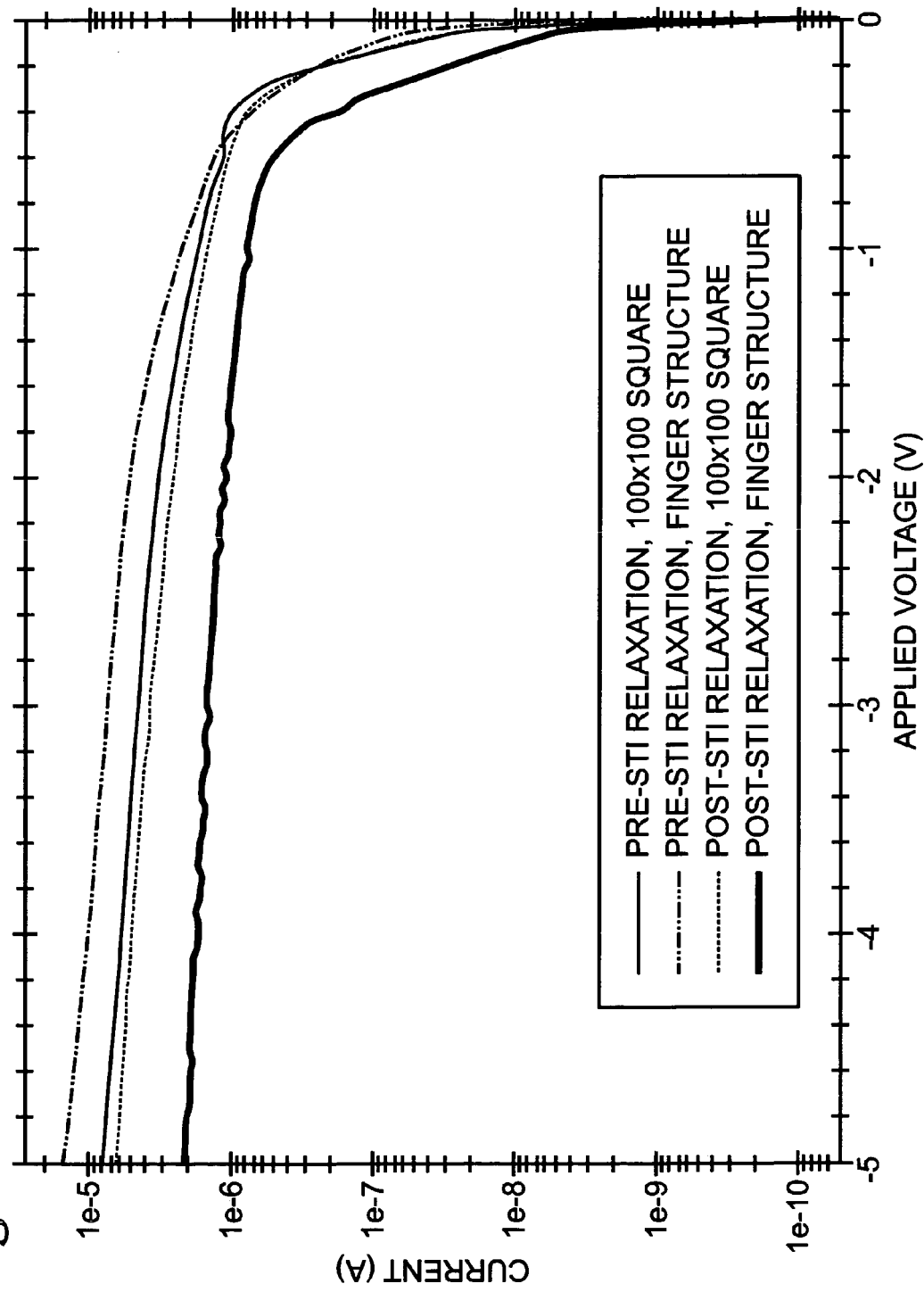
FIG. 18 depicts reverse leakage currents for two structures.

The structure used to generate the data of FIG. 18 is a diode structure which was generated by shallow trench isolation. The structure has two shapes of patterning: one is a square shaped, another is finger shaped. The finger shaped structure has a much higher edge-to-area ratio.

The reverse leakage currents on the P+N junction diodes are shown in FIG. 18. With the relaxation annealing step performed before the STI structure, the leakage current for the finger structure diode is higher than that for the 100 μm×100 μm square diode. While both diodes have the same area, they have different perimeter lengths. The leakage on the finger structure diode is less than that for the square structure diode if the relaxation anneal is performed after STI formation. This indicates the defect is propagating to the STI edge during the relaxation anneal.

In an alternate embodiment of the invention, the SiGe film and a silicon cap may be deposited simultaneously, wherein the SiGe film is about 3500 Å thick, and wherein the germanium content varies from about 20% at the bottom of the layer to 30% at the top of the layer. The silicon cap is about 200 Å thick. H+ ions are implanted into this film structure, at a dose of about $3 \cdot 10^{16}$ cm$^{-2}$, and at an energy level of about 34 keV. The structure is pattern with photoresist and plasma etched to form the trench structure. The photoresist is removed following etching, and the structure is relaxation annealed.

Thus, a method to form thick relaxed SiGe layer with trench structure has been disclosed. It will be appreciated that further variations and modifications thereof may be made within the scope of the invention as defined in the appended claims.

We claim:

1. A method of forming a SiGe layer having a relatively high germanium content and a relatively low threading dislocation density, comprising:
   preparing a silicon substrate;
   depositing, directly on the silicon substrate, a single, horizontal layer of strained SiGe to a thickness of between about 100 nm to 500 nm, wherein the germanium content of the SiGe layer is greater than 20%, by atomic ratio;
   implanting H+ ions into the SiGe layer at a dose of between about $1 \cdot 10^{16}$ cm$^{-2}$ to $5 \cdot 10^{16}$ cm$^{-2}$, at an energy of between about 20 keV to 45 keV;
   patterning the single SiGe layer with photoresist;
   plasma etching the structure to remove selected portions of the single SiGe layer and to form trenches about regions having side dimensions of 4 μm or less;
   removing the photoresist;
   thermal annealing the substrate and the remaining SiGe layer, to relax the remaining SiGe layer to reduce threading dislocations thereby forming a low defect relaxed SiGe layer; in an inert atmosphere at a temperature of between about 650° C. to 950° C. for between about 30 seconds and 30 minutes; and
   depositing a layer of tensile-strained silicon directly on the relaxed SiGe layer, without any intervening layers, to a thickness of between about 5 nm to 30 nm.

2. The method of claim 1 wherein said depositing a layer of SiGe includes depositing the layer of SiGe at a temperature of between about 400° C. to 600° C.

3. The method of claim 1 which further includes, after said thermal annealing, depositing a layer of relaxed SiGe having a thickness of about 100 nm directly on the relaxed SiGe layer.

4. The method of claim 1 wherein said thermal annealing is done in an argon atmosphere.

5. The method of claim 1 wherein said patterning includes patterning the structure in a checkerboard pattern.

6. A method of forming a SiGe layer having a relatively high germanium content and a relatively low threading dislocation density, comprising:
   preparing a silicon substrate;
   depositing, directly on the silicon substrate, a single, horizontal layer of strained SiGe, wherein the germanium content of the SiGe layer is greater than 20%, by atomic ratio;
   implanting H+ ions into the single SiGe layer at a dose of between about $1 \cdot 10^{16}$ cm$^{-2}$ to $5 \cdot 10^{16}$ cm$^{-2}$, at an energy of between about 20 keV to 45 key;
   patterning the single SiGe layer with photoresist in a checkerboard pattern;
   plasma etching the structure to remove selected portions of the single SiGe layer and to form trenches about regions having width and length dimensions less than or equal to 4 μm×4 μm;
   removing the photoresist;
   thermal annealing the substrate and the remaining SiGe layer, to relax the remaining SiGe layer to reduce threading dislocations thereby forming a low defect relaxed SiGe layer, in an inert atmosphere at a temperature of between about 650° C. to 950° C. for between about 30 seconds and 30 minutes;

depositing, after said thermal annealing, a layer of relaxed SiGe having a thickness of about 100 nm directly on the relaxed SiGe layer; and depositing a layer of tensile-strained silicon directly on the relaxed SiGe layer without any intermediate layer, to a thickness of between about 5 nm to 30 nm.

7. The method of claim 6 wherein said depositing a layer of SiGe includes depositing the layer of SiGe at a temperature of between about 400° C. to 600° C.

8. The method of claim 6 wherein said thermal annealing is done in an argon atmosphere.

9. A method of forming a SiGe layer having a relatively high germanium content and a relatively low threading dislocation density, comprising:

preparing a silicon substrate;

depositing, directly on the silicon substrate, a single, horizontal layer of strained SiGe in a graded structure, wherein the germanium content of the SiGe layer is about 20%, by atomic ratio, adjacent the silicon substrate and about 30% at the top of the SiGe layer, at a temperature of between about 400° C. to 600° C.;

implanting H+ ions into the SiGe layer at a dose of between about $1 \cdot 10^{16}$ cm$^{-2}$ to $5 \cdot 10^{16}$ cm$^{-2}$, at an energy of between about 20 keV to 45 keV;

patterning the single SiGe layer with photoresist in a checkerboard pattern;

plasma etching the structure to remove selected portions of the single SiGe layer and to form trenches about regions;

removing the photoresist;

thermal annealing the substrate and the remaining SiGe layer, to relax the remaining SiGe layer to reduce threading dislocations thereby forming a low defect relaxed SiGe layer, in an inert atmosphere at a temperature of between about 650° C. to 950° C. for between about 30 seconds and 30 minutes; and depositing a layer of tensile-strained silicon directly on the relaxed SiGe layer to a thickness of between about 5 nm to 30 nm.

10. The method of claim 9 which further includes, after said thermal annealing, depositing a layer of relaxed SiGe having a thickness of about 100 nm directly on the relaxed SiGe layer.

11. The method of claim 9 wherein said thermal annealing is done in an argon atmosphere.

12. The method of claim 9 wherein said implanting is performed after said patterning and said plasma etching.

13. The method of claim 9 wherein said plasma etching the structure to form trenches includes forming trenches about regions wherein the regions have width and length dimensions less than or equal to 4 μm×4 μm.

* * * * *